US006813754B2

(12) United States Patent
Wu et al.

(10) Patent No.: US 6,813,754 B2
(45) Date of Patent: Nov. 2, 2004

(54) PLACEMENT PROCESSING FOR PROGRAMMABLE LOGIC DEVICES

(75) Inventors: Qinghong Wu, Santa Clara, CA (US); Yinan Shen, Sunnyvale, CA (US); Liren Liu, Sunnyvale, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

(21) Appl. No.: 10/288,668

(22) Filed: Nov. 5, 2002

(65) Prior Publication Data

US 2004/0088663 A1 May 6, 2004

(51) Int. Cl.$^7$ .............................................. G06F 17/50
(52) U.S. Cl. ............................................ 716/10; 716/6
(58) Field of Search ....................................... 716/6, 10

(56) References Cited

U.S. PATENT DOCUMENTS

| | | | |
|---|---|---|---|
| RE34,363 E | | 8/1993 | Freedman .................... 307/465 |
| 5,448,493 A | | 9/1995 | Topolewski et al. ......... 364/489 |
| 5,659,484 A | * | 8/1997 | Bennett et al. ................ 716/16 |
| 5,740,069 A | * | 4/1998 | Agrawal et al. ............... 716/16 |
| 5,825,662 A | * | 10/1998 | Trimberger ..................... 716/3 |
| 6,086,629 A | | 7/2000 | McGettigan et al. .......... 716/12 |
| 6,086,631 A | * | 7/2000 | Chaudhary et al. ............ 716/16 |
| 6,127,843 A | * | 10/2000 | Agrawal et al. ............... 326/40 |
| 6,130,551 A | * | 10/2000 | Agrawal et al. ............... 326/39 |
| 6,208,163 B1 | * | 3/2001 | Wittig et al. ................... 326/39 |

OTHER PUBLICATIONS

"Efficient Algorithms for Extracting the K. Most Critical Paths in Timing Analysis," by Steve H.C. Yen, David H.C. Du, S. Ghanta, Department of Computer Science, University of Minnesota, Minneapolis, MN 55455, 26th ACM/IEE Design Automation Conference, pp. 649–654, 1989.

* cited by examiner

*Primary Examiner*—Stacy A. Whitmore
(74) *Attorney, Agent, or Firm*—Steve Mendelsohn; Yuri Gruzdvov

(57) ABSTRACT

A method for placing configurable logic blocks (CLBs) in a PLD, such as an FPGA. In one embodiment, after packing gates/clusters into blocks and then assigning those blocks to CLBs to generate an initial placement, the packing and/or placement of CLBs is changed prior to performing CLB routing. For each node of the most critical of the K most critical paths in the initial placement, moving the node to a different CLB is considered in order to reduce the criticality of that path. A move is applied if certain acceptability conditions are met. After the most critical path is improved, the criticality of the K paths is updated, and the procedure is repeated for the new most critical of the K updated paths. The method, which can be automated to reduce human intervention in the design process, improves circuit performance, e.g., by enabling higher circuit operation frequencies.

26 Claims, 6 Drawing Sheets

PLACEMENT PROCESSING FOR PROGRAMMABLE LOGIC DEVICES

TECHNICAL FIELD

The present invention relates to programmable logic devices (PLDs), such as field-programmable gate arrays (FPGAs), and, more specifically, to computer-aided design (CAD) tools for such devices.

BACKGROUND

An FPGA is a programmable logic device having an array of configurable logic blocks (CLBs) connected together via a programmable routing structure. A typical FPGA may have tens of thousands of CLBs, each CLB having a plurality of primitive logic cells (or gates). Primitive cells of a CLB may be interconnected in a variety of ways to implement a desired logic function corresponding to that CLB.

FIGS. 1A–C illustrate a representative FPGA 100 comprising a plurality of CLBs 102 surrounded by input-output (I/O) blocks 104 and interconnected through a routing structure 106. CLBs 102 are typically connected to form a plurality of nets, one of which, net 108, is depicted in FIG. 1B. Illustratively, net 108 has ten CLBs 102 interconnected via routing structure 106 (not shown in FIG. 1B) as indicated by the solid lines. The physical dimensions of net 108 are characterized by a bounding box 110 shown by the dashed line in FIG. 1B. A different net may include a different number of CLBs 102 and/or I/O blocks 104. Each CLB 102 and/or I/O block 104 may belong to more than one net.

FIG. 1C shows schematically a representative structure of a configurable logic block. CLB 102 of FIG. 1C includes clusters 112–128. Each cluster has one or more primitive cells and is configured to implement a particular logic function/operation. For example, a cluster may be a look-up table (LUT), D-type flip-flop (DFF), multiplexer (MUX), carry chain, counter, multiplier, etc. Clusters within each CLB 102 may be interconnected in different ways to form one or more groups of clusters. A group may be defined as a set of one or more interconnected clusters in a CLB that are not connected to any other clusters in that CLB. Illustratively, clusters 112–116 are interconnected to form a first group 130 of clusters. Similarly, clusters 118–126 are interconnected to form a second group 132 of clusters. Cluster 128 is not connected to other clusters within CLB 102 and is referred to as an unrelated cluster (i.e., a single-cluster group). However, like all clusters, cluster 128 may be connected to one or more cells/clusters located in one or more different CLBs.

When an FPGA, such as FPGA 100 of FIG. 1, comprises thousands of CLBs in a large number of nets, the task of establishing the required multitude of interconnections between the CLBs in a net and between the different nets becomes so onerous that it requires CAD implementation. Accordingly, manufacturers of FPGAs including the assignee hereof, Lattice Semiconductor, Inc., develop place-and-route CAD tools to be used, e.g., by their customers (FPGA programmers) to implement their respective circuit designs. Typically, place-and-route software implements an iterative process aimed at producing a circuit configuration that meets certain customer specifications, such as insertion delays between specified pins and/or operation (clock) frequency. However, human intervention is often required to refine/finalize the CAD-optimized circuit configuration. Such intervention is relatively time-consuming and may result in longer time to market and higher product development costs.

SUMMARY

The problems in the prior art are addressed in accordance with the principles of the present invention by a method for placing configurable logic blocks (CLBs) in a programmable logic device (PLD), such as a field-programmable gate array. In certain embodiments, after packing gates/clusters into blocks and then assigning those blocks to CLBs (e.g., using simulated annealing) to generate an initial placement for the PLD, the method changes the packing and/or placement of one or more CLBs prior to performing CLB routing. According to one embodiment, the K most critical paths in the initial placement are identified. For each node (e.g., a primitive cell or a cluster) of the most critical of the K paths (e.g., the path with the longest delay), moving the node to a different CLB located within a certain area adjacent to the current CLB is considered in order to reduce the criticality of that path. A move is applied if certain acceptability conditions are met. After the most critical path is improved, the rest of the identified paths are updated and the procedure is repeated for the new most critical of those K paths. In a preferred implementation, the present invention involves a combination of a net-based placement procedure, such as simulated annealing, with path-based node relocation. The method, which can be automated to reduce human intervention in the design process, improves circuit performance, e.g., by enabling higher circuit operation frequencies.

According to one embodiment, the present invention is a method of mapping a plurality of circuit elements onto a plurality of configurable logic blocks (CLBs) in a programmable logic device (PLD). According to the method, a mapping of the circuit elements to the CLBs in the PLD is generated, a critical path is selected in the PLD corresponding to the mapping, and, for at least one node of the critical path, node assignment is changed from a current location to a different location based on change of circuit performance corresponding to the change in node assignment.

According to another embodiment, the present invention is a circuit mapping generated by implementing the previously described method. According to yet another embodiment, the present invention is a machine-readable medium, having encoded thereon program code, wherein, when the program code is executed by a machine, the machine implements the previously described method.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Placement is part of the design process, during which CLB nets (such as net 108 in FIG. 1B) are mapped onto physical locations in a PLD, such as an FPGA. Timing-driven placement (TDP) is a placement method based on optimizing (e.g., minimizing) circuit delays. TDP methods have been classified as either net-based or path-based. Net-based TDP methods seek to control delays, e.g., by imposing on each net a delay upper bound that is related to the size of the net bounding box, such as box 110 for net 108 of FIG. 1B. Path-based TDP methods seek to explicitly take into account delays corresponding to each signal propagation path. Optimization of relatively large FPGAs is typically net-based since explicit enumeration of all paths becomes a difficult task.

Figure 1A:
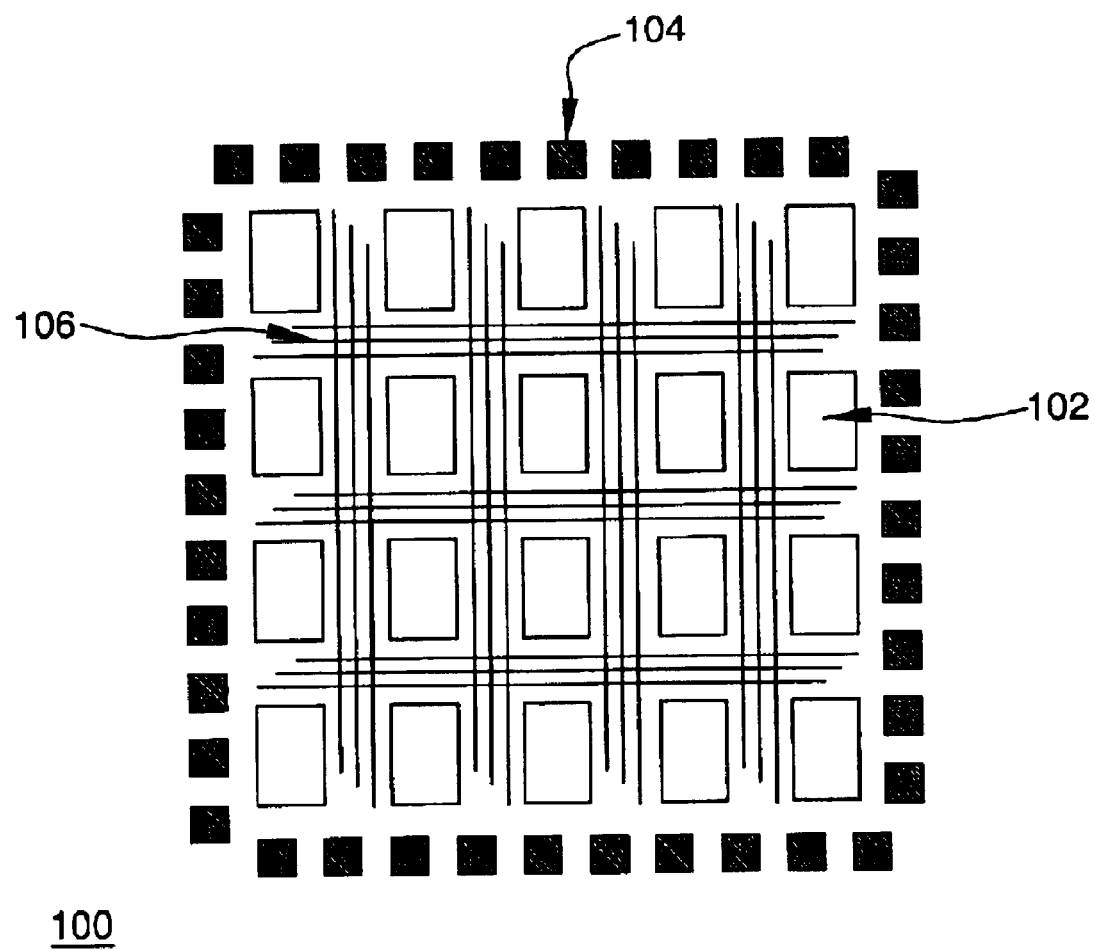
FIGS. 1A–C show block diagrams of a representative FPGA.
Figure 1B:
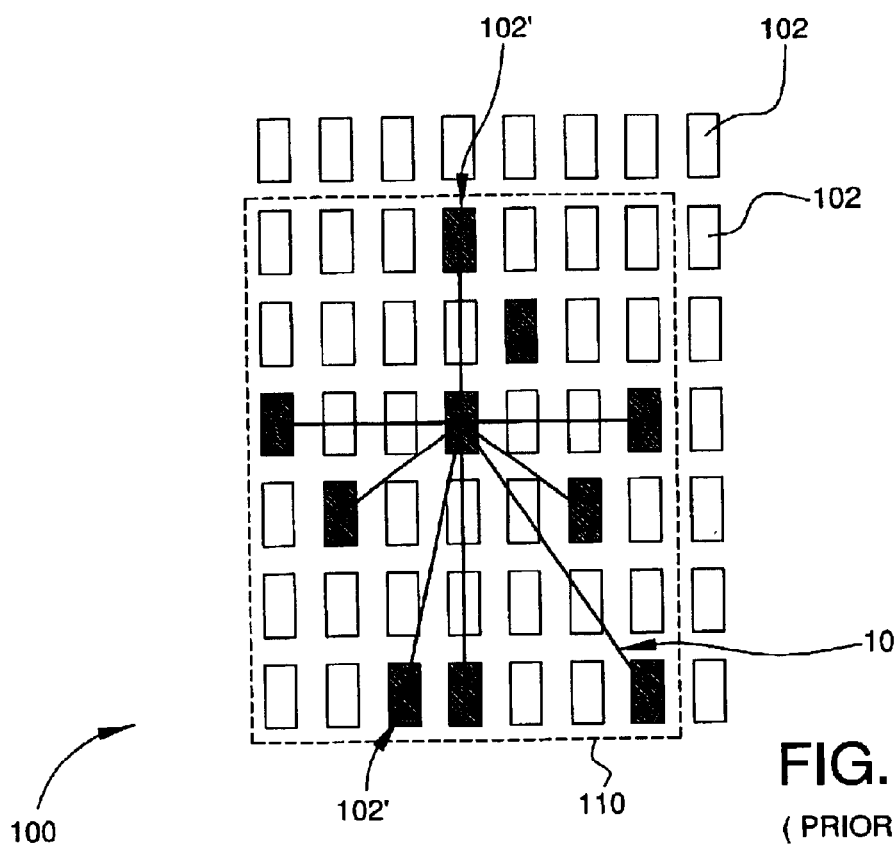
Figure 1C:
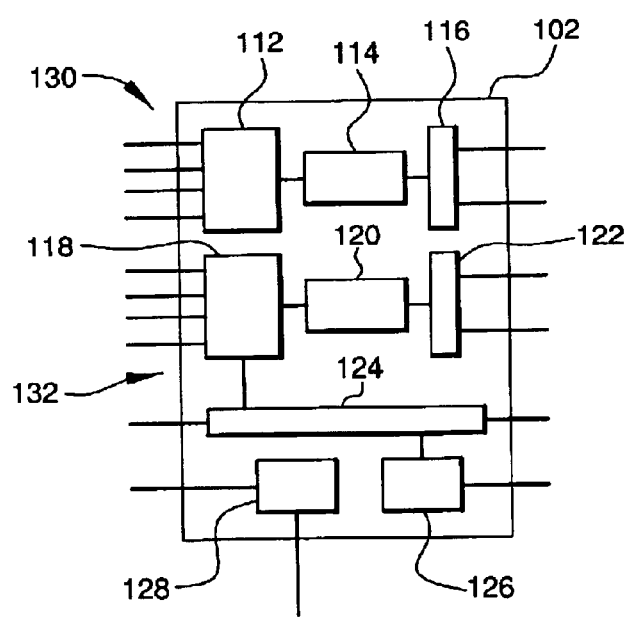
Figure 2:
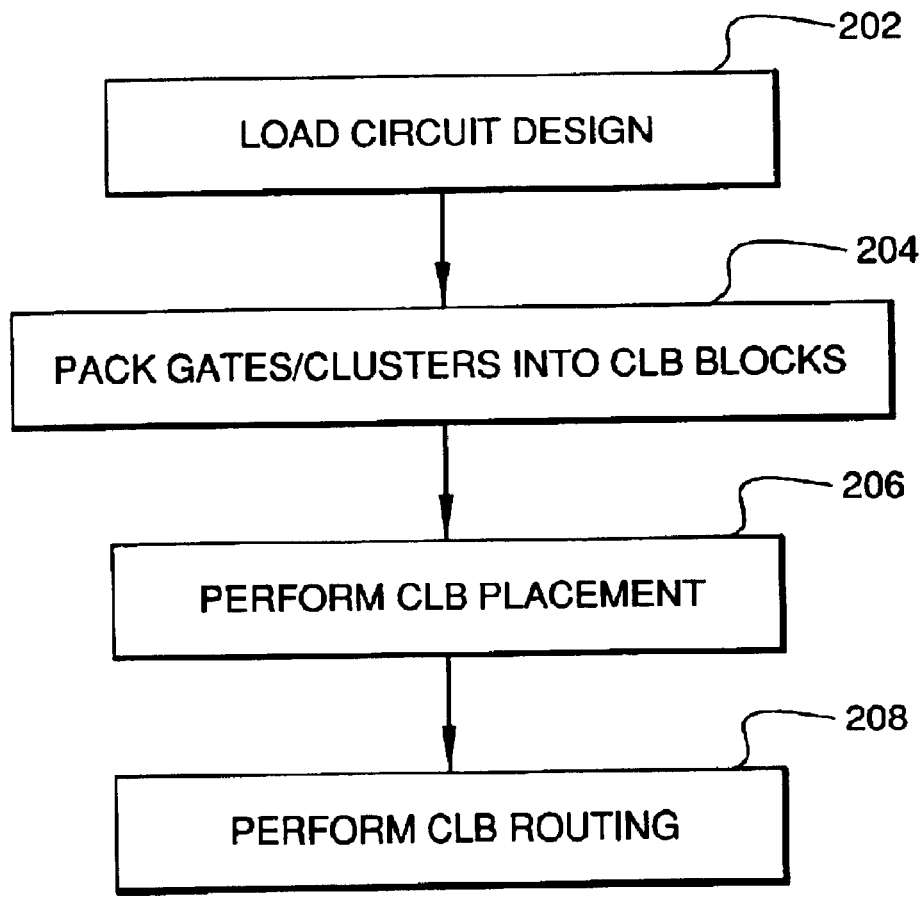
FIG. 2 is a flowchart of a place-and-route method that may be used for implementing a particular logic circuit using the FPGA of FIG. 1.

FIG. 2 is a flowchart of a place-and-route method 200 that may be used for implementing a particular logic circuit using a PLD such as FPGA 100 of FIG. 1. In process block 202 of method 200, a logic circuit design is loaded into a CAD tool. In block 204, a packing algorithm is run to assign (pack) logic cells/clusters corresponding to the design to different blocks that will eventually be mapped to CLBs in the FPGA. Typically, the packing algorithm optimizes local connectivity between cells and/or clusters and, for example, attempts to place a group of related clusters (e.g., group 110 in FIG. 1C) into a single block rather than distributing that group over different blocks. Block 204 is followed by block 206, which is typically a net-based placement process block. In block 206, the packed blocks are mapped (placed) onto CLBs 102 in FPGA 100. Block 206 may, for example, be a TDP block implemented using a simulated annealing (SA) algorithm. After block 206, each CLB may have one or more of the following: (i) one or more groups of clusters (such as groups 110 and 120 in FIG. 1C); (ii) one or more unrelated clusters (such as cluster 140 in FIG. 1C); and (iii) unassigned (i.e., unutilized) gates/cells/clusters (not shown in FIG. 1C). Then, in block 208, routing structure 106 is configured to route the interconnections between different CLBs corresponding to the placement generated in block 206.

One problem with method 200 is associated with unrelated clusters, such as cluster 140 (FIG. 1C). For example, if unrelated clusters are not packed into CLBs, the utilization of hardware resources in FPGA 100 may become disadvantageously low. On the other hand, packing unrelated clusters into CLBs may significantly impair circuit performance due to the substantial circuit delays associated with signal propagation between unrelated clusters and clusters in other CLBs. One way to deal with the above-indicated problem is by human intervention. In particular, prior to process block 208 of method 200, the current placement may be evaluated by an engineer using, e.g., a graphical user interface. The engineer may choose to move some cells/clusters from their current CLBs to different CLBs to improve circuit performance. However, as indicated earlier, such human intervention is relatively time-consuming and may not be feasible for large circuits.

Figure 3:
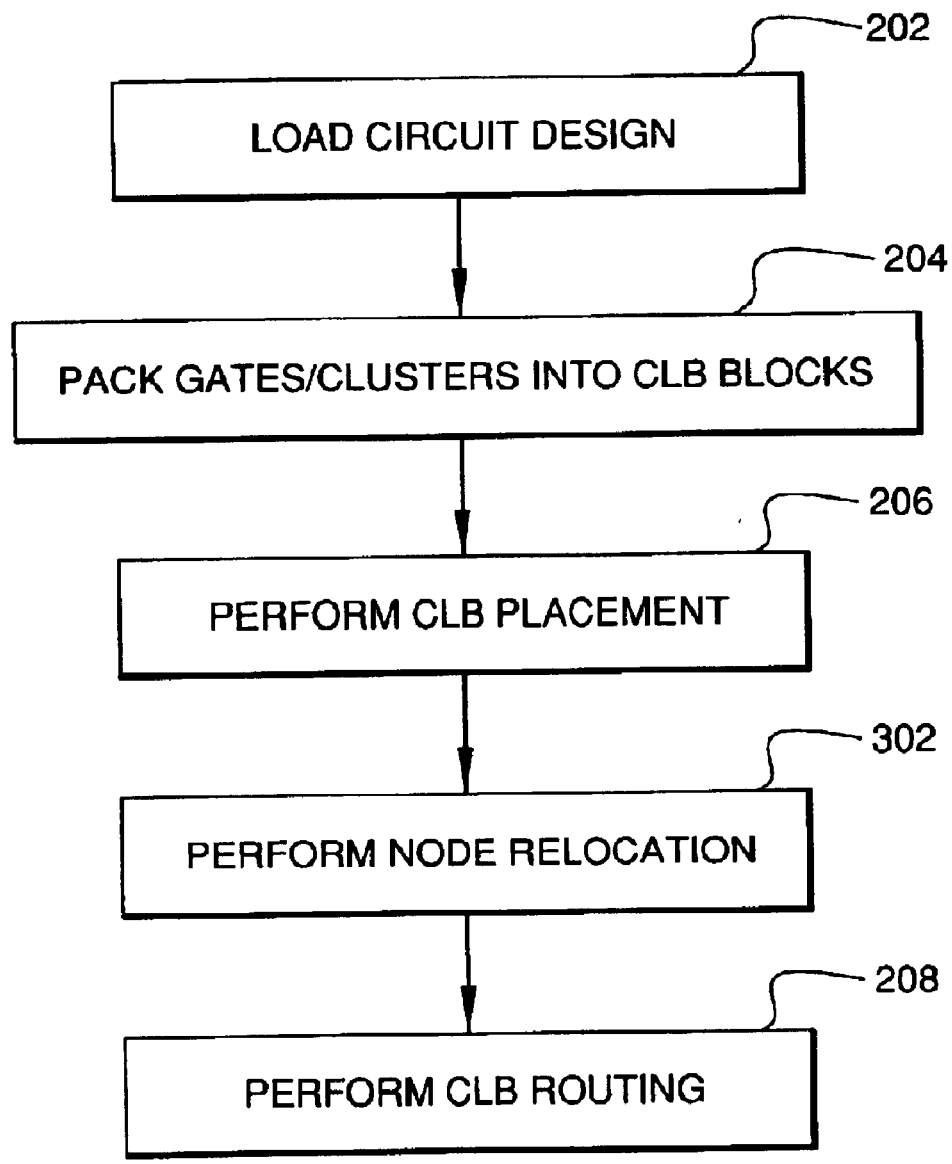
FIG. 3 is a flowchart of a place-and-route method according to one embodiment of the present invention.

FIG. 3 is a flowchart of a place-and-route method 300 according to one embodiment of the present invention. Method 300 is similar to method 200 of FIG. 2. However, in addition to process blocks 202–208, method 300 includes block 302, which is preferably performed between blocks 206 and 208. As will be discussed in more detail below, during block 302, a CAD tool attempts to revise some of the packing decisions of block 204 and/or the placement decisions of block 206 to improve circuit performance. In one implementation, block 302 is path-based and is performed without human intervention. Alternatively, as described below, certain parts of block 302 may be performed manually to enable a user of the CAD tool to provide input on node relocation. The CAD tool could provide hints of critical paths, their delay values, and possible improvement suggestions to a user. Then, the user would be able to make changes either through a description file or through a GUI (Graphical User Interface) such as a floor-planner.

Figure 4:
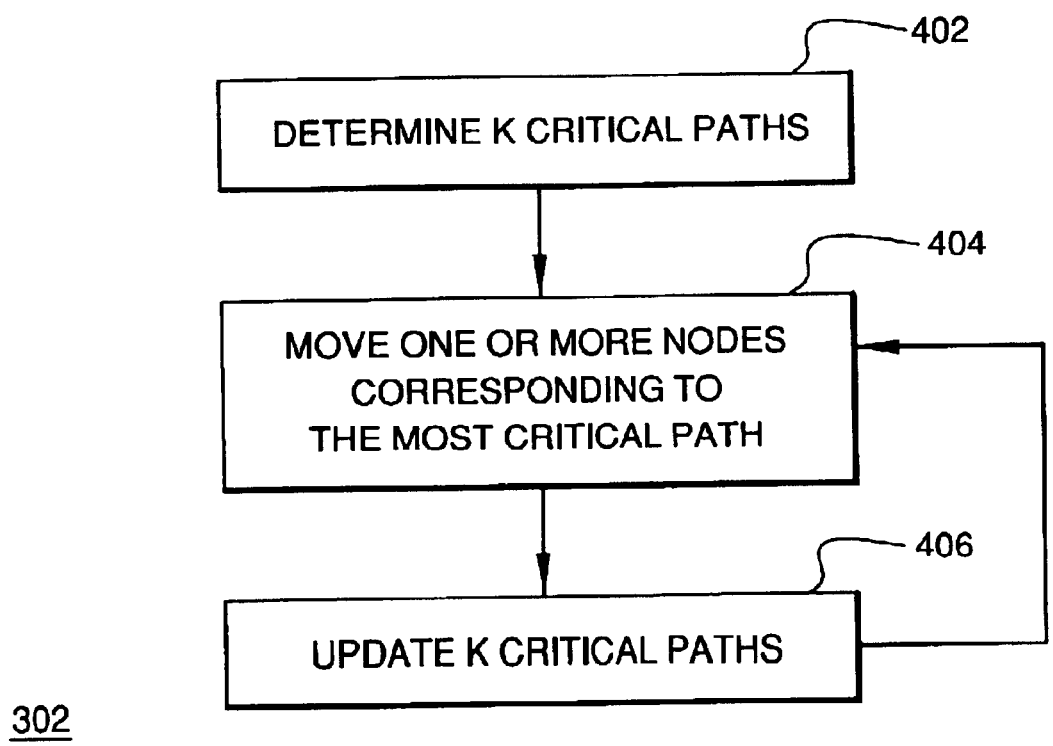
FIG. 4 is a flowchart of a node relocation act in the method of FIG. 3 according to one embodiment of the present invention.

FIG. 4 is a flowchart of block 302 according to one embodiment of the present invention. In block 402, the K most critical paths (i.e., those paths having the longest signal propagation delays) corresponding to the placement of CLBs generated in block 206 (FIG. 3) are determined and sorted based on their criticality (e.g., from longest to shortest delay). Different algorithms for determining critical paths are known in the art. For example, one such algorithm is disclosed by S. H. C. Yen, D. H. C. Du, and S. Ghanta in an article entitled "Efficient Algorithms for Extracting the K Most Critical Paths in Timing Analysis" (paper 39.1 in the Proceedings of the 26-th ACM/IEEE Design Automation Conference, 1989, pages 649–654), the teachings of which are incorporated herein by reference. K is typically selected to be between 100 and 1000.

In process block 404, following block 402, one or more nodes of the most critical of the K paths are moved to one or more different CLBs in order to reduce the delay of that path. This move may be done automatically by a CAD tool or manually by a user who selects the one or more nodes and/or one or more CLBs based on the hints provided by the CAD tool. Each different node may be a set of two or more interconnected clusters in the same CLB (e.g., group 132 in FIG. 1C or clusters 118, 120, and 122 in FIG. 1C), an unrelated cluster (e.g., cluster 128 in FIG. 1C), a primitive cell, or a single gate. In block 406, the signal propagation delays of the K paths are updated based on the modification made in block 404, and the K paths are re-sorted. If the path modified in block 404 remains the most critical of the K updated paths, then the processing of block 302 is terminated. However, if a different path of the K updated paths becomes the most critical path, then the processing returns to block 404, where node relocation for the new most critical path is performed. In one implementation, blocks 404 and 406 are repeated until (1) the current most critical path remains the most critical of the K paths after node relocation and (2) the delay corresponding to that path cannot be reduced any further, after which the processing is terminated. In a different implementation, the processing may be terminated when the delay corresponding to the current most critical path becomes less than a specified threshold value. The final placement from block 302 is used for configuring routing structure 106 in block 208 of method 300.

In the embodiment described above, block 406 is implemented by updating only the K paths originally identified in block 402. In a different embodiment, block 406 may be implemented by determining a new set of K most critical paths after the modification of block 404, similar to the original determination performed in block 402.

Figure 5B:
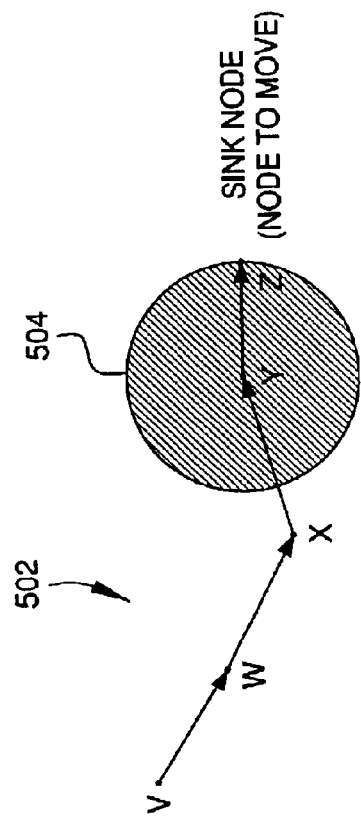
FIGS. 5A–B show schematically a node relocation technique that may be used in the method of FIG. 3 according to one embodiment of the present invention.
Figure 5A:
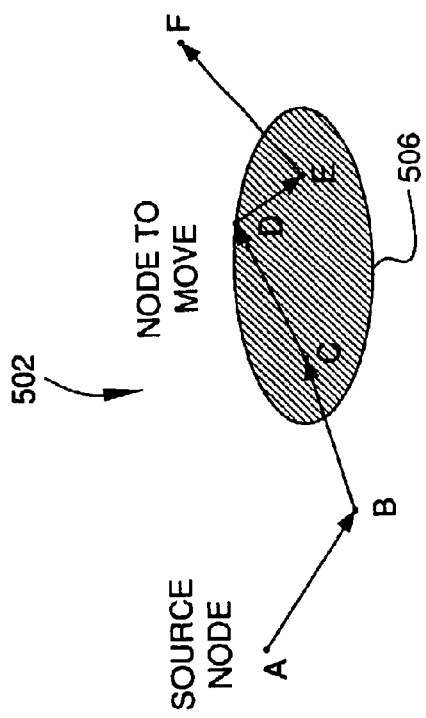

FIGS. 5A–B illustrate a node relocation technique that may be used in block 404 according to one embodiment of the present invention. In particular, FIGS. 5A–B show schematically two parts of a critical path (labeled 502), where different arrows indicate signal routes between different nodes of that path. Nodes (A–F), shown in FIG. 5A, are the first six nodes of path 502, while nodes (V–Z), shown in FIG. 5B, are the last five nodes of path 502. Since a node may correspond to either an entire group or just a portion of a group within a CLB, each consecutive pair of nodes in path 502 may fall within either two different CLBs or the same CLB.

FIG. 5B illustrates node relocation for a terminal node (e.g., sink node Z) of path 502. More specifically, an attempt is made to move node Z to a different location within a circle (labeled 504 in FIG. 5B) centered at the connecting node (i.e., node Y) and having a radius corresponding to a specified distance measure between nodes Y and Z. In one implementation, the distance measure is the Manhattan distance (i.e., the sum of vertical and horizontal distances) between nodes Y and Z. Source node A of FIG. 5A (i.e., another terminal node) may be similarly relocated.

FIG. 5A illustrates node relocation for an intermediate node (e.g., node D) of path 502. More specifically, an attempt is made to move node D to a different location within an ellipse (labeled 506 in FIG. 5A). Ellipse 506 is defined such that (I) the two connecting nodes (i.e., nodes C and E) are the foci of the ellipse, and (II) the size of the major axis of ellipse 506 corresponds to a specified distance measure. In one implementation, the specified distance measure is the sum of the Manhattan distances between (1) nodes C and D and (2) nodes D and E. Different intermediate cells may be similarly relocated.

Note that, although Manhattan distances are preferred, the areas depicted in FIGS. 5A–B are based on Cartesian distances, another possible distance measure.

In one embodiment, relocation of each node is attempted by identifying a possible move. Different types of possible moves include: (i) swapping two similar nodes between two different CLBs; (ii) moving a node into an unassigned area of a different CLB; and (iii) swapping two dissimilar nodes between two different CLBs. Similar nodes are nodes involving equivalent sets of circuitry. As such, similar nodes may be swapped without involving any other circuitry. For example, when two nodes each consist of a LUT and a DFF, such similar nodes may be swapped without involving any other circuitry. Dissimilar nodes, on the other hand, are nodes involving unequal sets of circuitry. As such, swapping dissimilar nodes will involve other circuitry. For example, in order for a node consisting of a LUT and a DFF in a first CLB to be swapped with another node consisting of a LUT in a second CLB, the second CLB must also have an unassigned DFF to implement the node moved from the first CLB. In such a case, the first CLB would end up with an unassigned DFF in addition to a node consisting of a LUT.

If a move is available, then the move is evaluated using one or more specified conditions. Possible conditions include: (a) whether the move reduces the delay of the current path, (b) whether the move increases the delay of any of the rest of the K paths, (c) whether the move increases the delay of any other path in the FPGA; (d) whether the move increases the size of the bounding box (e.g., the sum of the vertical and horizontal dimensions of box 110 in FIG. 1B) for any net by more than a predefined threshold amount (e.g., 0.1%). If the specified conditions are satisfied, then the move is acceptable. If more than one move for the current node is acceptable, then additional criteria may be used to select a "best" move from the different acceptable moves. Such additional criteria may be, for example, the move that results in the greatest decrease (or least increase) in the relative sizes of the bounding boxes for the affected nets.

In one embodiment, node relocation (e.g., as illustrated in FIG. 5) is attempted for all nodes of path 502 until the delay corresponding to that path can no longer be improved or no acceptable moves are available. In one implementation, node relocation for path 502 is performed successively, e.g., starting at one terminal node (e.g., source node A) and proceeding toward the opposing terminal node (e.g., sink node Z) in the connecting order in path 502 (e.g., B, C, D, . . . , X, Y, Z). After node Z has been processed, the processing returns to node A and again proceeds toward node Z. The processing continues until no more nodes can be relocated. In another implementation, the processing is performed in an order determined based on the individual delay values corresponding to each particular node in path 502. For example, the processing order may be determined by (a) ascertaining, for each terminal node, the delay between that terminal node and the corresponding connecting node and, for each intermediate node, the sum of delays between that node and the two connecting nodes; and (b) selecting the order of processing in the order of decreasing individual delay values. After the node corresponding to the smallest individual delay has been processed, the individual delay values are updated and the processing returns to the node having the current largest individual delay. The processing continues until no more nodes can be relocated.

Table I compares the results of circuit optimization obtained by applying methods 200 and 300 to several representative benchmark circuits. In particular, Table I indicates a maximum clock frequency obtained for one of the global clocks in each circuit using the two methods.

TABLE I

Maximum Clock Frequency Improvement

| Circuit # | Circuit Characteristics: Nos. of (LUTs)/ (DFFs)/(Embedded memory blocks)/(I/O blocks)/(Global clocks) | Method 200 (MHz) | Method 300 (MHz) | Improvement (%) |
| --- | --- | --- | --- | --- |
| 1 | 6383/3699/4/114/6 | 48.8 | 51.7 | 5.94 |
| 2 | 7100/4338/38/371/2 | 58 | 58.7 | 1.21 |
| 3 | 8475/4201/70/399/3 | 71.8 | 71.8 | 0.00 |
| 4 | 9941/2272/40/326/3 | 46.1 | 50.8 | 10.20 |
| 5 | 10504/1625/0/100/1 | 26.7 | 27.2 | 1.87 |
| 6 | 9236/6888/64/401/64 | 83.1 | 103.6 | 24.67 |
| Average | | | | 7.31 |

The first and second columns of the table show circuit number and circuit characteristics, respectively. The third and fourth columns show the maximum clock frequency obtained using method 200 and method 300, respectively. The fifth column shows the relative improvement of the maximum clock frequency obtained with method 300 over that of method 200. As indicated in the table, the outcome of method 300 is generally better than that of method 200, with an average improvement of 7.3% for the six exemplary circuits.

While this invention has been described with reference to illustrative embodiments, this description is not intended to be construed in a limiting sense. Although the present invention was described in reference to simulated annealing, it may also be used in conjunction with other optimization algorithms/methods, such as, for example, a partition-placement algorithm or a mincement cut placement algorithm. In addition, the present invention may be applied to different PLD architectures (e.g., block-structured or channel-structured) and implementation technologies (e.g., SRAM or anti-fuse) as well as PLDs other than FPGAs, such as Field-Programmable Logic Arrays (PLAs), Simple Programmable Logic Devices (SPLDs), and Complex Programmable Logic Devices (CPLDs).

Although certain embodiments of the present invention have been described in the context of swapping pairs of nodes, the invention is not so limited. In general, the present invention can be implemented using any suitable placement modification, including those involving more than two nodes at a time.

Although the present invention has been described in the context of time constraints (circuit delays), alternative or additional constraints, such as those related to power, routing congestion, or routing overlaps, may be applied. Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit. As would be apparent to one skilled in the art, various functions of circuit elements may also be implemented as part of a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus, for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Although the acts in the following method claims, if any, are recited in a particular sequence with corresponding labeling, unless the claim recitations otherwise imply a particular sequence for implementing some or all of those acts, those acts are not necessarily intended to be limited to being implemented in that particular sequence.

What is claimed is:

1. A method of mapping a plurality of circuit elements onto a plurality of configurable logic blocks (CLBs) in a programmable logic device (PLD), comprising:

generating a mapping of the circuit elements to the GLBs in the PLD;

selecting a critical path in the PLD corresponding to the mapping, wherein:

the critical path comprises a first node in a first GLB in the PLD; and the first CLB further comprises one or more other nodes; and changing node assignment of the first node from a current location to a different location without changing node assignment of at least one other node in the first CLB, wherein:

the change in node assignment results in a change of circuit performance;

the different location falls within an area adjacent to the current location;

the first node is a terminal node; and the area is a circle centered at a connecting node having a radius corresponding to a distance measure between the terminal and connecting nodes.

2. The invention of claim 1, wherein the method is implemented using a computer.

3. The invention of claim 2, wherein changing node assignment is performed automatically by the computer.

4. The invention of claim 2, wherein changing node assignment involves manual interaction by a user of the computer in response to hints provided by the computer.

5. The invention of claim 1, wherein generating the mapping includes:

packing circuit elements of a circuit design into blocks, each block corresponding to a CLB; and generating the mapping by assigning the blocks to the CLBs in the PLD.

6. The invention of claim 5, wherein the mapping is generated using simulated annealing.

7. The invention of claim 1, wherein, for changing node assignment, the first node comprises a plurality of circuit elements.

8. The invention of claim 1, wherein:

selecting the critical path comprises:

identifying K critical paths in the PLD, where K>1; and selecting a most critical path of the K critical paths; and the method further comprises:

selecting a new most critical path from K updated critical paths corresponding to the change in node assignment; and changing node assignment for the new most critical path.

9. The invention of claim 1, wherein the distance measure is the Manhattan distance between the terminal and connecting nodes.

10. The invention of claim 1, wherein the change of circuit performance includes at least one of:

(i) change of one or more delays corresponding to one or more different paths having the reassigned node; and (ii) size change of a bounding box for at least one net having the reassigned node.

11. The invention of claim 1, wherein changing node assignment includes at least one of:

(1) swapping two similar nodes between two locations;

(2) moving a node into an unassigned area of a new location; and (3) swapping two dissimilar nodes between two locations.

12. The invention of claim 1, wherein:

the first CLB comprises a plurality of primitive elements; and the first node comprises a subset of the plurality of primitive elements in the first GLB.

13. The invention of claim 1, wherein the critical path is a signal path having a longest signal propagation delay in the mapping.

14. A circuit mapping generated by implementing a method of mapping a plurality of circuit elements onto a plurality of configurable logic blocks (CLBs) in a programmable logic device (PLD), the method comprising:

generating an initial mapping of the circuit elements to the CLBs in the PLD;

selecting a critical path in the PLD corresponding to the initial mapping, wherein:
the critical path comprises a first node in a first CLB in the PLD; and
the first CLB further comprises one or more other nodes; and
changing node assignment of the first node from a current location to a different location without changing node assignment of at least one other node in the first CLB, wherein:
the change in node assignment results in a change of circuit performance;
the different location falls within an area adjacent to the current location;
the first node is a terminal node; and
the area is a circle centered at a connecting node and having a radius corresponding to a distance measure between the terminal and connecting nodes.

15. A programmed PLD having a plurality of circuit elements mapped onto a plurality of CLBs, the PLD generated by implementing a method comprising:
generating a mapping of the circuit elements to the CLBs in the PLD;
selecting a critical path in the PLD corresponding to the mapping, wherein:
the critical path comprises a first node in a first CLB in the PLD; and
the first CLB further comprises one or more other nodes; and
changing node assignment of the first node from a current location to a different location without changing node assignment of at least one other node in the first CLB, wherein;
the change in node assignment results in a change of circuit performance;
the different location falls within an area adjacent to the current location;
the first node is a terminal node; and
the area is a circle centered at a connecting node and having a radius corresponding to a distance measure between the terminal and connecting nodes.

16. A machine-readable medium, having encoded thereon program code, wherein, when the program code is executed by a machine, the machine implements a method of mapping a plurality of circuit elements onto a plurality of configurable logic blocks (CLBs) in a programmable logic device (PLD), the method comprising:
generating a mapping of the circuit elements to the CLBs in the PLD;
selecting a critical path in the PLD corresponding to the mapping, wherein:
the critical path comprises a first node in a first CLE in the PLD; and
the first CLB further comprises one or more other nodes; and
changing node assignment of the first node from a current location to a different location without changing node assignment of at least one other node in the first CLB, wherein:
the change in node assignment results in a change of circuit performances;
the different location falls within an area adjacent to the current location;
the first node is a terminal node; and
the area is a circle centered at a connecting node and having a radius corresponding to a distance measure between the terminal and connecting nodes.

17. The invention of claim 16, wherein generating the mapping includes:
packing circuit elements of a circuit design into blocks, each block corresponding to a CLB; and
generating the mapping by assigning the blocks to the CLBs in the PLD.

18. The invention of claim 16, wherein:
selecting the critical path comprises:
identifying K critical paths in the PLD, where K>1; and
selecting a most critical path of the K critical paths; and
the method further comprises:
selecting a new most critical path from K updated critical paths corresponding to the change in node assignment; and
changing node assignment for the new most critical path.

19. The invention of claim 16, wherein the change of circuit performance includes at least one of:
(i) change of one or more delays corresponding to one or more different paths having the reassigned node; and
(ii) size change of a bounding box for at least one net having the reassigned node.

20. A method of mapping a plurality of circuit elements onto a plurality of configurable logic blocks (GLBs) in a programmable logic device (PLD), comprising:
generating a mapping of the circuit elements to the CLBs in the PLD;
selecting a critical path in the PLD corresponding to the mapping; and
for at least one node of the critical path, changing node assignment from a current location to a different location, wherein:
the change in node assignment results in a change of circuit performance;
the different location falls within an area adjacent to the current location;
the node is a terminal node; and
the area is a circle centered at a connecting node and having a radius corresponding to a distance measure between the terminal and connecting nodes.

21. The invention of claim 20, wherein the distance measure is the Manhattan distance between the terminal and connecting nodes.

22. A method of mapping a plurality of circuit elements onto a plurality of configurable logic blocks (CLBs) in a programmable logic device (PLD), comprising:
generating a mapping of the circuit elements to the CLBs in the PLD;
selecting a critical path in the PLD corresponding to the mapping; and
for at least one node of the critical path, changing node assignment from a current location to a different location, wherein:
the change in node assignment results in a change of circuit performance;
the different location falls within an area adjacent to the current location;
the node is an intermediate node; and
the area is an ellipse having the foci at two connecting nodes.

23. A machine-readable medium, having encoded thereon program code, wherein, when the program code is executed by a machine, the machine implements a method of mapping a plurality of circuit elements onto a plurality of configurable logic blocks (CLBs) in a programmable logic device (PLD), the method comprising:

generating a mapping of the circuit elements to the CLBs in the PLD;

selecting a critical path in the PLD corresponding to the mapping; and for at least one node of the critical path, changing node assignment from a current location to a different location, wherein:

the change in node assignment results in a change of circuit performance;

the different location falls within an area adjacent to the current location;

the node is a terminal node; and the area is a circle centered at a connecting node and having a radius corresponding to a distance measure between the terminal and connecting nodes.

24. A machine-readable medium, having encoded thereon program code, wherein, when the program code is executed by a machine, the machine implements a method of mapping a plurality of circuit elements onto a plurality of configurable logic blocks (CLBs) in a programmable logic device (PLD), the method comprising:

generating a mapping of the circuit elements to the CLBs in the PLD;

selecting a critical path in the PLD corresponding to the mapping; and for at least one node of the critical path, changing node assignment from a current location to a different location, wherein:

the change in node assignment results in a change of circuit performance;

the different location falls within an area adjacent to the current location;

the node is an intermediate node; and the area is an ellipse having the foci at two connecting nodes.

25. A method of mapping a plurality of circuit elements onto a plurality of configurable logic blocks (CLBs) in a programmable logic device (PLD), comprising:

generating a mapping of the circuit elements to the CLBs in the PLD;

selecting a critical path in the PLD corresponding to the mapping, wherein:

the critical path comprises a first node in a first CLB in the PLD; and the first CLB further comprises one or more other nodes; and changing node assignment of the first node from a current location to a different location without changing node assignment of at least one other node in the first CLB, wherein:

the change in node assignment results in a change of circuit performance;

the different location falls within an area adjacent to the current location;

the first node is an intermediate node; and the area is an ellipse having the foci at two connecting nodes.

26. A machine-readable medium, having encoded thereon program code, wherein, when the program code is executed by a machine, the machine implements a method of mapping a plurality of circuit elements onto a plurality of configurable logic blocks (CLBs) in a programmable logic device (PLD), the method comprising:

generating a mapping of the circuit elements to the CLBs in the PLD;

selecting a critical path in the PLD corresponding to the mapping, wherein:

the critical path comprises a first node in a first CLB in the PLD; and the first CLB further comprises one or more other nodes; and changing node assignment of the first node from a current location to a different location without changing node assignment of at least one other node in the first GLB, wherein:

the change in node assignment results in a change of circuit performance;

the different location falls within an area adjacent to the current location;

the first node is an intermediate node; and the area is an ellipse having the foci at two connecting nodes.

* * * * *